United States Patent
Kim

(10) Patent No.: US 9,711,204 B1
(45) Date of Patent: Jul. 18, 2017

(54) SEMICONDUCTOR DEVICE(S) AND METHOD OF REFRESHING THE SEMICONDUCTOR DEVICE

(71) Applicant: SK hynix Inc., Icheon-si Gyeonggi-do (KR)

(72) Inventor: Youk Hee Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/175,119

(22) Filed: Jun. 7, 2016

(30) Foreign Application Priority Data

Feb. 22, 2016  (KR) .......................... 10-2016-0020840

(51) Int. Cl.
| | |
|---|---|
| *G11C 7/00* | (2006.01) |
| *G11C 11/406* | (2006.01) |
| *G11C 17/16* | (2006.01) |
| *G11C 17/18* | (2006.01) |
| *G11C 11/408* | (2006.01) |
| *G11C 29/00* | (2006.01) |

(52) U.S. Cl.
CPC ........ *G11C 11/406* (2013.01); *G11C 11/4085* (2013.01); *G11C 17/16* (2013.01); *G11C 17/18* (2013.01); *G11C 29/78* (2013.01)

(58) Field of Classification Search
CPC ................ G11C 11/406; G11C 29/783; G11C 11/40618; G11C 11/4085

USPC .............................. 365/222, 200, 96, 230.06
See application file for complete search history.

(56) References Cited

U.S. PATENT DOCUMENTS

| | | | | |
|---|---|---|---|---|
| 6,078,543 A | * | 6/2000 | Kim ...................... | G11C 11/406 365/222 |
| 7,460,420 B2 | * | 12/2008 | Sunaga ................. | G11C 11/408 365/200 |
| 2012/0307583 A1 | | 12/2012 | Okahiro et al. | |

FOREIGN PATENT DOCUMENTS

KR        1020150026227 A        3/2015

* cited by examiner

*Primary Examiner* — David Lam
(74) *Attorney, Agent, or Firm* — William Park & Associates Ltd.

(57) ABSTRACT

A method of refreshing a semiconductor device may be provided. A semiconductor device may include a refresh control circuit and a memory circuit. The refresh control circuit may be configured to compare addresses generated based on a command with fail addresses to generate a normal word line signal and a redundancy word line signal which are enabled during a predetermined time section from a point of time that the command is inputted to the refresh control circuit. The memory circuit may be configured to inactivate a fail word line connected to a failed memory cell based on the addresses if the normal word line signal is enabled and activates a redundancy word line replacing the fail word line if the redundancy word line signal is enabled.

22 Claims, 7 Drawing Sheets

SEMICONDUCTOR DEVICE(S) AND METHOD OF REFRESHING THE SEMICONDUCTOR DEVICE

CROSS-REFERENCE TO RELATED APPLICATIONS

The present application claims priority under 35 U.S.C 119(a) to Korean Patent Application No. 10-2016-0020840, filed on Feb. 22, 2016, which is herein incorporated by references in its entirety.

BACKGROUND

1. Technical Field

Embodiments of the present disclosure generally relate to a semiconductor device or semiconductor devices and refresh methods thereof.

2. Related Art

In the electronics industry, highly integrated fast volatile memory devices such as high performance dynamic random access memory (DRAM) devices widely used as memory devices are increasingly in demand with the development of high performance electronic systems. High performance electronic systems are, for example, personal computers or communication systems. In particular, when semiconductor devices such as the DRAM devices are employed in cellular phones or notebook computers, the semiconductor devices have to be designed to have an excellent low power consumption characteristic. Accordingly, a lot of effort has been focused on reduction of an operation current and a standby current of the semiconductor devices.

A data retention characteristic of a DRAM cell including a single transistor and a single storage capacitor may be very sensitive to a temperature. Thus, the DRAM devices may perform a refresh operation that senses data stored in the DRAM cells and rewrites the data into the DRAM cells in an appropriate period according to the data retention characteristics of the DRAM cells.

Semiconductor memory devices may be designed and fabricated to include a test mode function for evaluating their operations and redundancy memory cells for a repair operation. That is, various parameters of the semiconductor memory devices may be measured in a test mode at a wafer level or at a package level and the tested semiconductor memory devices may be sorted into good chips, repairable chips, or failed chips according to the test results. If the repairable chips are successfully repaired by the repair operation, the repairable chips may be classified into good chips. The repair operation may be performed to replace word lines connected to failed memory cells with redundancy word lines connected to the redundancy memory cells.

SUMMARY

According to an embodiment, a semiconductor device may be provided. The semiconductor device may include a refresh control circuit and a memory circuit. The refresh control circuit may be configured to compare addresses generated based on a command with fail addresses to generate a normal word line signal and a redundancy word line signal which may be enabled during a predetermined time section from a point of time that the command is inputted to the refresh control circuit. The memory circuit may be configured to inactivate a fail word line connected to a failed memory cell based on the addresses if the normal word line signal is enabled and may activate a redundancy word line replacing the fail word line if the redundancy word line signal is enabled.

According to an embodiment, there may be provided a refresh method of a semiconductor device. The refresh method may include performing a first refresh operation and performing a second refresh operation. The first refresh operation may be performed to generate a normal word line signal and a redundancy word line signal based on a command if a combination of addresses is consistent with a combination of fail addresses. The normal word line signal and the redundancy word line signal may be enabled during a predetermined time section from a point of time that the command is inputted. The second refresh operation may be performed to inactivate a fail word line connected to a failed memory cell included in a first mat based on the normal word line signal, to activate a plurality of normal word lines included in a second mat based on the normal word line signal, and to activate a redundancy word line included in the second mat to replace the fail word line of the first mat based on the redundancy word line signal.

According to an embodiment, there may be provided a refresh method of a semiconductor device. The refresh method may include performing a first refresh operation, performing a second refresh operation, and performing a third refresh operation. The first refresh operation may be performed to generate a normal word line signal and a redundancy word line signal based on a command if a combination of addresses is consistent with a combination of fail addresses. The normal word line signal and the redundancy word line signal may be enabled during a predetermined time section from a point of time that the command is inputted. The second refresh operation may be performed to inactivate a first fail word line connected to a failed memory cell included in a first mat based on the normal word line signal, to activate a first normal word line included in a second mat based on the normal word line signal, and to activate a first redundancy word line included in the second mat to replace the first fail word line of the first mat based on the redundancy word line signal. The third refresh operation may be performed to inactivate a second fail word line connected to a failed memory cell included in a third mat based on the normal word line signal, to activate a second normal word line included in a fourth mat based on the normal word line signal, and to activate a second redundancy word line included in the fourth mat to replace the second fail word line of the third mat based on the redundancy word line signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor device(s) and refresh methods thereof.

Figure 1:
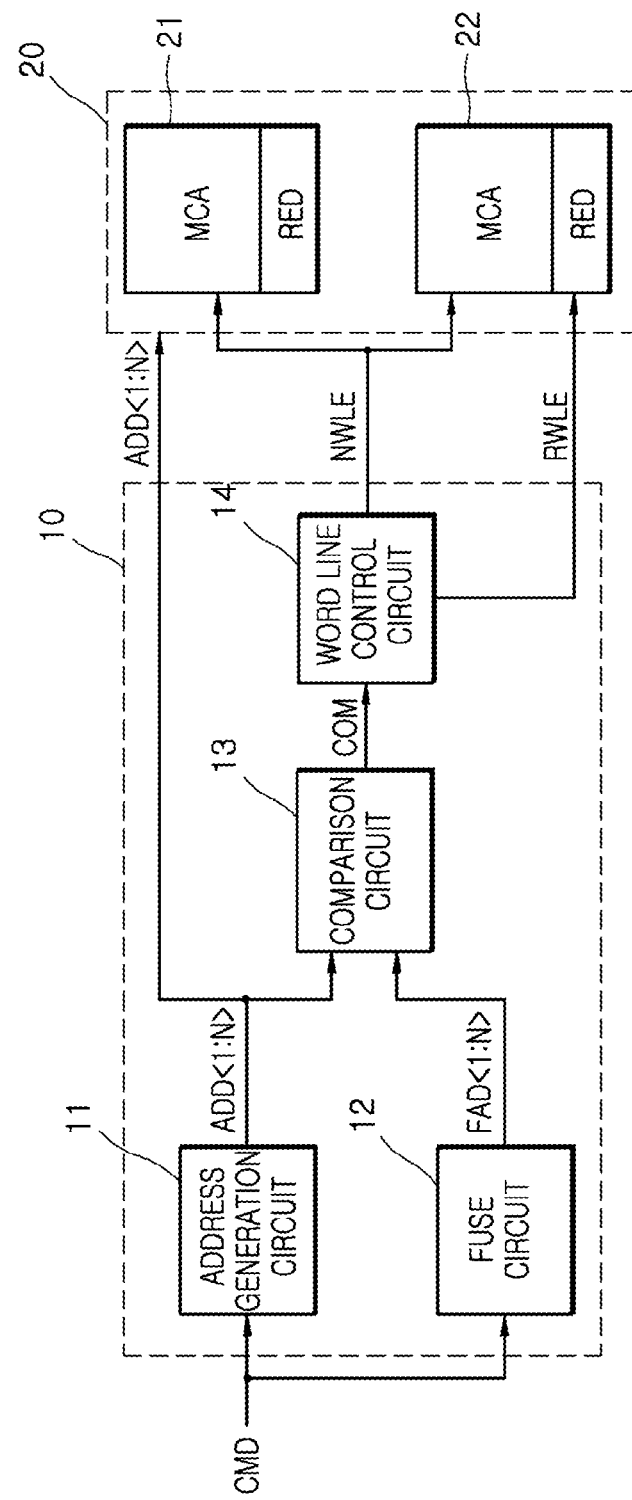
FIG. 1 is a block diagram illustrating a representation of an example of a configuration of a semiconductor device according to an embodiment.

Referring to FIG. 1, a semiconductor device according to an embodiment may include a refresh control circuit 10 and a memory circuit 20. The refresh control circuit 10 may include an address generation circuit 11, a fuse circuit 12, a comparison circuit 13 and a word line control circuit 14. The memory circuit 20 may include a first mat 21 and a second mat 22.

The address generation circuit 11 may generate first to $N^{th}$ addresses ADD<1:N> that are sequentially counted in response to commands CMD. The commands CMD may be set to be signals for activating a plurality of normal word lines included in the first and second mats 21 and 22. The commands CMD may be provided from an external device for a refresh operation. The number of bits of the first to $N^{th}$ addresses ADD<1:N> may be set to be different according to the embodiments. The number of bits of the first to $N^{th}$ addresses ADD<1:N> may be determined according to the number of the normal word lines included in the first and second mats 21 and 22.

The fuse circuit 12 may include a plurality of fuse cells and may output first to $N^{th}$ fail addresses FAD<1:N> according to electrical open/short states of the plurality of fuse cells in response to the commands CMD. The fuse circuit 12 may be realized using a fuse array including the plurality of fuse cells which are arrayed to be connected to each other. The first to $N^{th}$ fail addresses FAD<1:N> may include information on positions of fail word lines among the normal word lines included in the first and second mats 21 and 22. The number of bits of the first to $N^{th}$ fail addresses FAD<1:N> may be set to be equal to the number of the bits of the first to $N^{th}$ addresses ADD<1: N>.

The comparison circuit 13 may compare the first to $N^{th}$ fail addresses FAD<1:N> with the first to $N^{th}$ addresses ADD<1:N> to generate a comparison signal COM. The comparison circuit 13 may generate the comparison signal COM which is enabled if a combination of the first to $N^{th}$ fail addresses FAD<1:N> is consistent with a combination of the first to $N^{th}$ addresses ADD<1:N>. A logic level of the enabled comparison signal COM may be set differently according to the embodiments.

The word line control circuit 14 may generate a normal word line signal NWLE and a redundancy word line signal RWLE in response to the comparison signal COM. The word line control circuit 14 may generate the normal word line signal NWLE and the redundancy word line signal RWLE which are sequentially enabled during a predetermined time section, in response to the comparison signal COM. The predetermined time section means a time period from a point of time that a first one of the commands CMD is inputted till a point of time that a second one of the commands CMD is inputted. An explanation of the predetermined time section will be described later.

In summary, the refresh control circuit 10 may compare the first to $N^{th}$ addresses ADD<1:N> generated in response to the commands CMD with the first to $N^{th}$ fail addresses FAD<1:N> to generate the normal word line signal NWLE and the redundancy word line signal RWLE which are sequentially enabled during a predetermined time section from a point of time that each of the commands CMD is inputted.

The first mat 21 may inactivate a fail word line in response to the normal word line signal NWLE if a combination of the first to $N^{th}$ addresses ADD<1:N> corresponds to a position of the fail word line connected to a failed memory cell. The first mat 21 may inactivate the fail word line if the normal word line signal NWLE is enabled. The first mat 21 may activate a plurality of normal word lines which are selected according to combinations of the first to $N^{th}$ addresses ADD<1:N> if the normal word line signal NWLE is disabled. The first mat 21 may activate a plurality of redundancy word lines which are selected according to combinations of the first to $N^{th}$ addresses ADD<1:N> if the normal word line signal NWLE is disabled. The first mat 21 may include a memory cell array MCA having the plurality of normal word lines and a redundancy cell array RED having the plurality of redundancy word lines that may be used to replace the fail word lines.

The second mat 22 may activate a plurality of normal word lines according to combinations of the first to $N^{th}$ addresses ADD<1:N> in response to the normal word line signal NWLE. The second mat 22 may activate a plurality of redundancy word lines replacing fail word lines in response to the redundancy word line signal RWLE. The second mat 22 may activate the plurality of normal word lines which are selected according to combinations of the first to $N^{th}$ addresses ADD<1:N> if the normal word line signal NWLE is enabled. The second mat 22 may activate the redundancy word lines replacing the fail word lines of the first mat 21 if the redundancy word line signal RWLE is enabled. The second mat 22 may include a memory cell array MCA having the plurality of normal word lines and a redundancy cell array RED having a plurality of redundancy word lines that may be used to replace the fail word lines.

In some embodiments, the first mat 21 may be realized to replace a fail word line therein with a redundancy word line included therein or with a redundancy word line included in another mat (e.g., the second mat 22 or a third mat (not illustrated)), and the second mat 22 may be realized to replace a fail word line therein with a redundancy word line included therein or with a redundancy word line included in another mat (e.g., the first mat 21 or the third mat (not illustrated)).

The memory circuit 20 may inactivate a fail word line connected to a failed memory cell in response to the first to $N^{th}$ addresses ADD<1:N> if the normal word line signal NWLE is enabled and may activate a redundancy word line replacing the fail word line if the redundancy word line signal RWLE is enabled.

Figure 2:
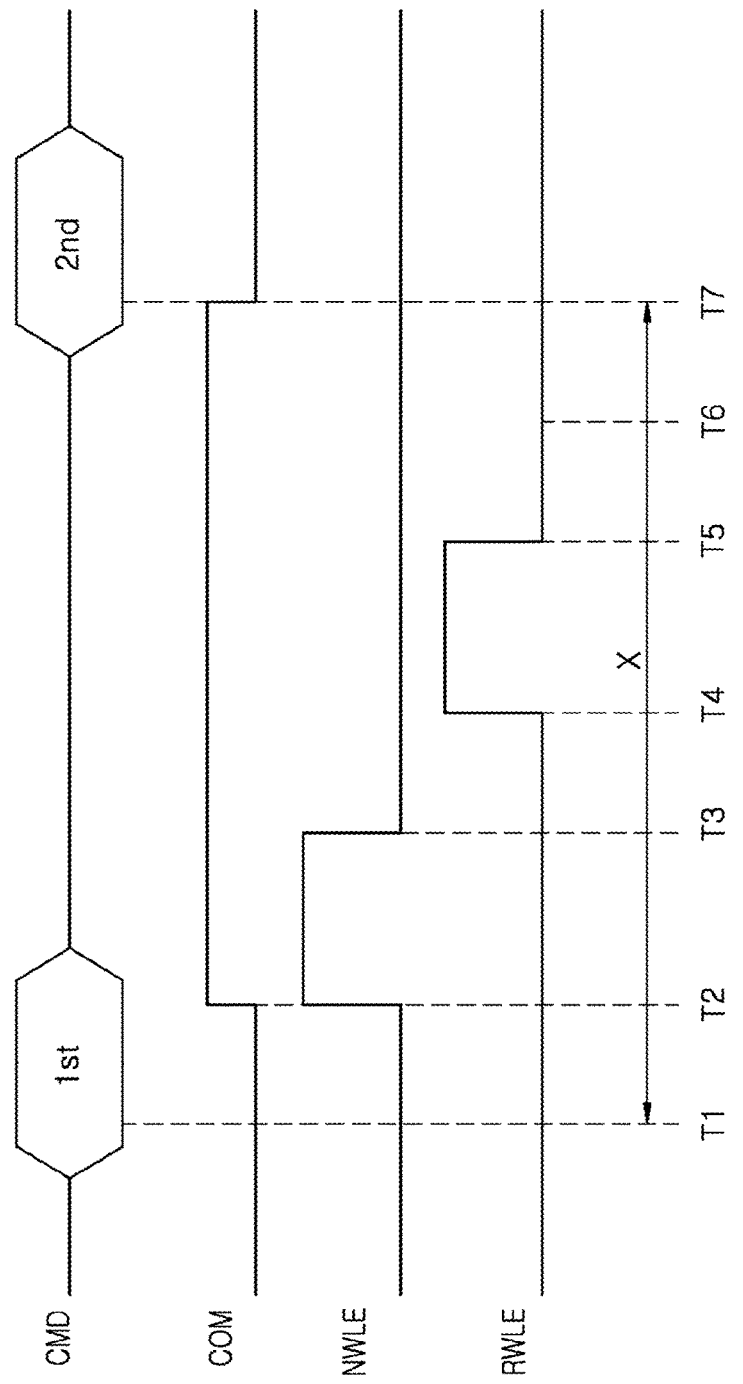
FIG. 2 is a timing diagram illustrating a representation of an example of an operation of the semiconductor device illustrated in FIG. 1.

An operation of a semiconductor device having an aforementioned configuration will be described hereinafter with reference to FIG. 2 in conjunction with an example in which any one of the normal word lines included in the first mat 21 is connected to one or more failed memory cells.

First, a time period from a point of time "T1" that a first one of the commands CMD is inputted till a point of time "T7" that a second one of the commands CMD is inputted is defined as a predetermined time section X.

The address generation circuit 11 may generate the first to $N^{th}$ addresses ADD<1:N> that are sequentially counted in response to the first one of the commands CMD.

The fuse circuit 12 may output the first to $N^{th}$ fail addresses FAD<1:N> including information on positions of fail word lines in response to the first one of the commands CMD.

At a point of time "T2", the comparison circuit 13 may generate the comparison signal COM which is enabled to have a logic "high" level if a combination of the first to $N^{th}$ addresses ADD<1:N> sequentially counted is consistent with a combination of the first to $N^{th}$ fail addresses FAD<1:N>.

The word line control circuit 14 may generate the normal word line signal NWLE having a logic "high" level in response to the comparison signal COM.

The normal word line signal NWLE may be set to have a pulse width from the point of time "T2" till the point of time "T3", and a time period from the point of time "T2" till the point of time "T3" may be set to be a row address strobe active time (tRAS) that the normal word lines are activated. A time period from the point of time "T3" till a point of time "T4" may be set to be a RAS pre-charge time (tRP) that corresponds to a pre-charge section of the normal word lines after the normal word lines are activated.

The first mat 21 may inactivate the fail word line which is selected by the first to $N^{th}$ addresses ADD<1:N>, in response to the normal word line signal NWLE.

The second mat 22 may activate normal word lines which are selected by the first to $N^{th}$ addresses ADD<1:N>, in response to the normal word line signal NWLE.

At the point of time "T4", the word line control circuit 14 may generate the redundancy word line signal RWLE having a logic "high" level after the normal word line signal NWLE is generated.

The redundancy word line signal RWLE may be set to have a pulse width from the point of time "T4" till a point of time "T5", and a time period from the point of time "T4" till the point of time "T5" may be set to be a row address strobe active time (tRAS) that the redundancy word lines are activated. A time period from the point of time "T5" till a point of time "T6" may be set to be a RAS pre-charge time (tRP) that corresponds to a pre-charge section of the redundancy word lines after the redundancy word lines are activated.

The second mat 22 may activate a redundancy word line replacing the fail word line in response to the redundancy word line signal RWLE.

The predetermined time section X may be set to be at least twice a sum of the row address strobe active time tRAS and the RAS pre-charge time tRP. The predetermined time section X may be set to have a time period that an activation operation of the word lines can be executed twice in response to each command CMD.

A semiconductor device according to an embodiment may efficiently execute a refresh operation by activating all of normal word lines connected to normal memory cells and redundancy word lines replacing fail word lines connected to failed memory cells in response to each command. In addition, since all of the normal word lines and the redundancy word lines are activated in response to each command, the number of times that the command for activating the word lines is inputted to the semiconductor device may be reduced to improve an operation speed of the semiconductor device operating according to the command.

Figure 3:
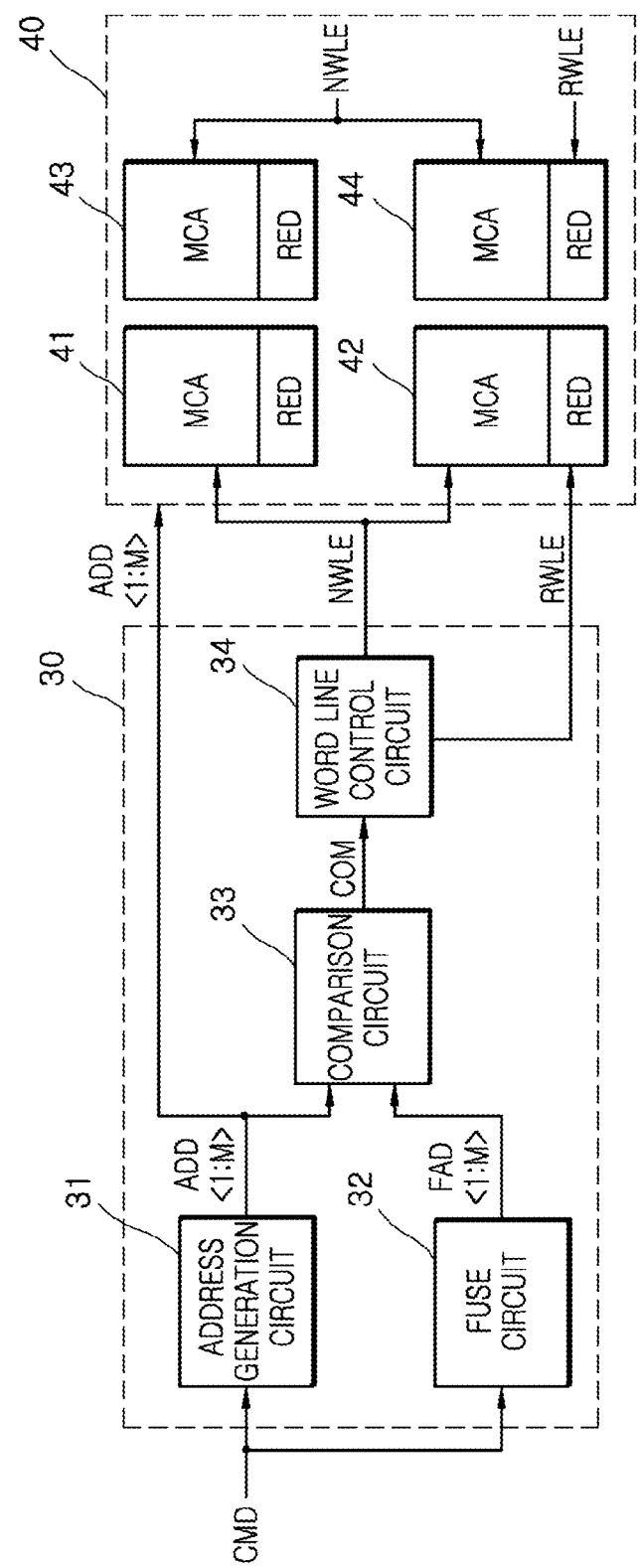
FIG. 3 is a block diagram illustrating a representation of an example of a configuration of a semiconductor device according to an embodiment.

Referring to FIG. 3, a semiconductor device according to an embodiment may include a refresh control circuit 30 and a memory circuit 40. The refresh control circuit 30 may include an address generation circuit 31, a fuse circuit 32, a comparison circuit 33 and a word line control circuit 34. The memory circuit 40 may include a first mat 41 and a second mat 42, a third mat 43 and a fourth mat 44.

The address generation circuit 31 may generate first to $M^{th}$ addresses ADD<1:M> that are sequentially counted in response to commands CMD. The commands CMD may be set to be signals for activating a plurality of normal word lines included in the first to fourth mats 41, 42, 43 and 44. The commands CMD may be provided from an external device for a refresh operation. The number of bits of the first to $M^{th}$ addresses ADD<1:M> may be set to be different according to the embodiments. The number of bits of the first to $M^{th}$ addresses ADD<1:M> may be determined according to the number of the normal word lines included in the first to fourth mats 41, 42, 43 and 44.

The fuse circuit 32 may include a plurality of fuse cells and may output first to $M^{th}$ fail addresses FAD<1:M> according to electrical open/short states of the plurality of fuse cells in response to the commands CMD. The fuse circuit 32 may be realized using a fuse array including the plurality of fuse cells which are arrayed to be connected to each other. The first to $M^{th}$ fail addresses FAD<1:M> may include information on positions of fail word lines among the normal word lines included in the first to fourth mats 41, 42, 43 and 44. The number of bits of the first to $M^{th}$ fail addresses FAD<1:M> may be set to be equal to the number of the bits of the first to $M^{th}$ addresses ADD<1:M>.

The comparison circuit 33 may compare the first to $M^{th}$ fail addresses FAD<1:M> with the first to $M^{th}$ addresses ADD<1:M> to generate a comparison signal COM. The comparison circuit 33 may generate the comparison signal COM which is enabled if a combination of the first to $M^{th}$ fail addresses FAD<1:M> is consistent with a combination of the first to $M^{th}$ addresses ADD<1:M>. A logic level of the enabled comparison signal COM may be set to be different according to the embodiments.

The word line control circuit 34 may generate a normal word line signal NWLE and a redundancy word line signal RWLE in response to the comparison signal COM. The word line control circuit 34 may generate the normal word line signal NWLE and the redundancy word line signal RWLE which are sequentially enabled during a predetermined time section, in response to the comparison signal COM. The predetermined time section means a time period from a point of time that a first one of the commands CMD is inputted till a point of time that a second one of the commands CMD is inputted. An explanation of the predetermined time section will be described later.

The refresh control circuit 30 may compare the first to $M^{th}$ addresses ADD<1:M> generated in response to the commands CMD with the first to $M^{th}$ fail addresses FAD<1:M> to generate the normal word line signal NWLE and the redundancy word line signal RWLE which are sequentially enabled during a predetermined time section from a point of time that each of the commands CMD is inputted.

The first mat 41 may inactivate a fail word line in response to the normal word line signal NWLE if a combination of the first to $M^{th}$ addresses ADD<1:M> corresponds to a position of the fail word line connected to a failed memory cell. The first mat 41 may inactivate the fail word line if the normal word line signal NWLE is enabled. The first mat 41 may activate a plurality of normal word lines which are selected according to combinations of the first to $M^{th}$ addresses ADD<1:M> if the normal word line signal NWLE is disabled. The first mat 41 may activate a plurality of redundancy word lines which are selected according to combinations of the first to $M^{th}$ addresses ADD<1:M> if the normal word line signal NWLE is disabled. The first mat 41 may include a memory cell array MCA having the plurality of normal word lines and a redundancy cell array RED having the plurality of redundancy word lines that may be used to replace the fail word lines.

The second mat 42 may activate a plurality of normal word lines according to combinations of the first to $M^{th}$ addresses ADD<1:M> in response to the normal word line signal NWLE. The second mat 42 may activate a plurality of redundancy word lines replacing fail word lines in response to the redundancy word line signal RWLE. The second mat 42 may activate the plurality of normal word lines which are selected according to combinations of the first to $M^{th}$ addresses ADD<1:M> if the normal word line signal NWLE is enabled. The second mat 42 may activate the redundancy word lines replacing the fail word lines of the first mat 41 if the redundancy word line signal RWLE is enabled. The second mat 42 may include a memory cell array MCA having the plurality of normal word lines and a redundancy cell array RED having a plurality of redundancy word lines that may be used to replace the fail word lines.

The third mat 43 may inactivate a fail word line in response to the normal word line signal NWLE if a combination of the first to $M^{th}$ addresses ADD<1:M> corresponds to a position of the fail word line connected to a failed memory cell. The third mat 43 may inactivate the fail word line if the normal word line signal NWLE is enabled. The third mat 43 may activate a plurality of normal word lines which are selected according to combinations of the first to $M^{th}$ addresses ADD<1:M> if the normal word line signal NWLE is disabled. The third mat 43 may activate a plurality of redundancy word lines which are selected according to combinations of the first to $M^{th}$ addresses ADD<1:M> if the normal word line signal NWLE is disabled. The third mat 43 may include a memory cell array MCA having the plurality of normal word lines and a redundancy cell array RED having the plurality of redundancy word lines that may be used to replace the fail word lines.

The fourth mat 44 may activate a plurality of normal word lines according to combinations of the first to $M^{th}$ addresses ADD<1:M> in response to the normal word line signal NWLE. The fourth mat 44 may activate a plurality of redundancy word lines replacing fail word lines in response to the redundancy word line signal RWLE. The fourth mat 44 may activate the plurality of normal word lines which are selected according to combinations of the first to $M^{th}$ addresses ADD<1:M> if the normal word line signal NWLE is enabled. The fourth mat 44 may activate the redundancy word lines replacing the fail word lines of the third mat 43 if the redundancy word line signal RWLE is enabled. The fourth mat 44 may include a memory cell array MCA having the plurality of normal word lines and a redundancy cell array RED having a plurality of redundancy word lines that may be used to replace the fail word lines.

In some embodiments, each of the first to fourth mats 41, 42, 43 and 44 may be realized to replace a fail word line therein with a redundancy word line included therein or with a redundancy word line included in another mat.

The memory circuit 40 may inactivate a fail word line connected to a failed memory cell in response to the first to $M^{th}$ addresses ADD<1:M> if the normal word line signal NWLE is enabled and may activate a redundancy word line replacing the fail word line if the redundancy word line signal RWLE is enabled.

The semiconductor device illustrated in FIG. 3 may have substantially the same configuration as the semiconductor device described with reference to FIGS. 1 and 2 except the number of the mats. Thus, a description of operations of the semiconductor device illustrated in FIG. 3 will be omitted hereinafter.

A method of repairing a semiconductor device according to an embodiment will be described hereinafter with reference to FIGS. 4, 5 and 6 in conjunction with an example in which the semiconductor device includes a memory circuit comprised of first to fourth mats M1, M2, M3 and M4. In such a case, it is assumed that each of the first to fourth mats M1, M2, M3 and M4 is realized to include 8K (8×1024) normal word lines NWL and 64 redundancy word lines RWL. In addition, it is assumed that the first to fourth mats M1, M2, M3 and M4 constitute a single bank.

Figure 4:
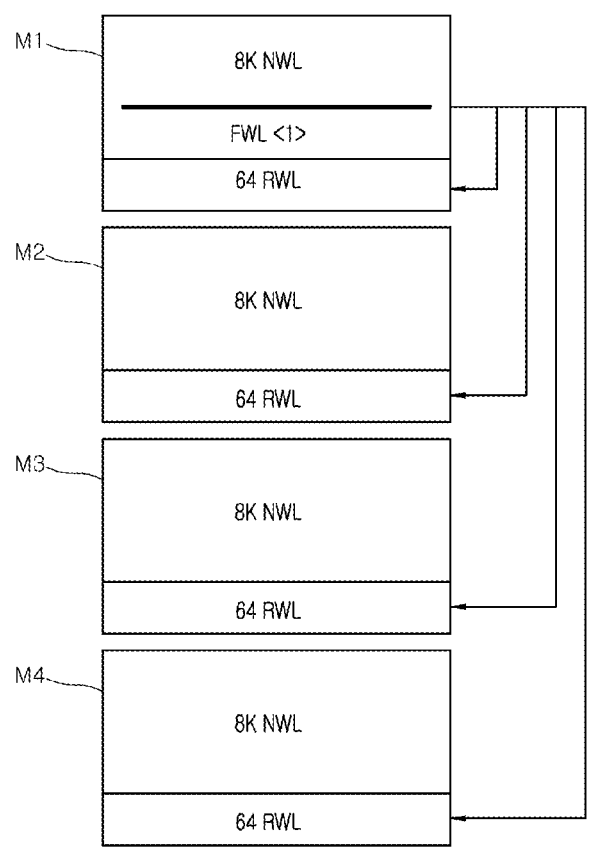
FIGS. 4, 5 and 6 are schematic diagrams illustrating examples of repair methods for applying a refresh method according to an embodiment.

FIG. 4 illustrates a case where one of the normal word lines NWL included in the first to fourth mats M1~M4 is a fail word line.

For example, FIG. 4 illustrates a case whereby one of the normal word lines NWL included in the first mat M1 among the first to fourth mats M1~M4 is a fail word line FWL<1>.

Referring to FIG. 4, the fail word line FWL<1> of the first mat M1 may be replaced with any one of the redundancy word lines RWL included in the first mat M1 (see an arrow).

In an embodiment, the fail word line FWL<1> of the first mat M1 may be replaced with any one of the redundancy word lines RWL included in the second mat M2 (see an arrow).

In an embodiment, the fail word line FWL<1> of the first mat M1 may be replaced with any one of the redundancy word lines RWL included in the third mat M3 (see an arrow).

In an embodiment, the fail word line FWL<1> of the first mat M1 may be replaced with any one of the redundancy word lines RWL included in the fourth mat M4 (see an arrow).

That is, if any one of the normal word lines NWL included in the first to fourth mats M1~M4 corresponds to the fail word line FWL<1>, the memory circuit may be designed such that the fail word line FWL<1> is replaced with any one of all of the redundancy word lines RWL included in the first to fourth mats M1~M4 regardless of a location of the mat including the redundancy word line replacing the fail word line FWL<1>.

Figure 5:
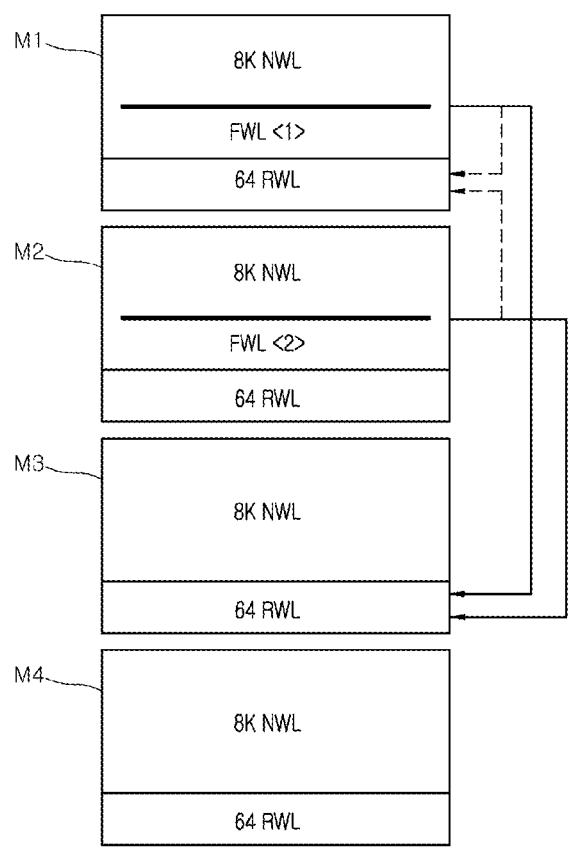

FIG. 5 illustrates a case where two fail word lines exist in the first to fourth mats M1~M4. For example, FIG. 5 illustrates a case where by one of the normal word lines NWL included in the first mat M1 among the first to fourth mats M1~M4 is a first fail word line FWL<1> and one of the normal word lines NWL included in the second mat M2 among the first to fourth mats M1~M4 is a second fail word line FWL<2>.

Referring to FIG. 5, the first fail word line FWL<1> of the first mat M1 may be replaced with any one of the redundancy word lines RWL included in the first mat M1 (see an arrow indicated by a dotted line).

The second fail word line FWL<2> may be replaced with any one of the remaining redundancy word lines RWL in the first mat M1 (see an arrow indicated by a dotted line).

The first fail word line FWL<1> of the first mat M1 may be replaced with any one of the redundancy word lines RWL included in the third mat M3 (see an arrow indicated by a solid line).

The second fail word line FWL<2> may be replaced with any one of the remaining redundancy word lines RWL in the third mat M3 (see an arrow indicated by a solid line).

That is, if one of the normal word lines NWL included in the first mat M1 corresponds to the first fail word line FWL<1> and one of the normal word lines NWL included in the second mat M2 corresponds to the second fail word line FWL<2>, the memory circuit may be designed such that the first and second fail word lines FWL<1> and FWL<2> are replaced with two of all of the redundancy word lines RWL included in the first to fourth mats M1~M4 regardless of locations of the mats.

In an embodiment, the first and second fail word lines FWL<1> and FWL<2> have to be replaced by redundancy word lines RWL of the same mat. For example, both the first and second fail word lines FWL<1> and FWL<2> have to be replaced by redundancy word lines RWL of only the first mat M1, second mat M2, third mat M3, or fourth mat M4. Thus, for example, the first fail word line FWL<1> is not replaced by a redundancy word line RWL of a mat different from what the mat of the second fail word line FWL<2> is replaced with.

In an embodiment, the first fail word line FWL<1> may be replaced by a redundancy word line RWL of any mat even if this mat used to replace the first fail word line FWL<1> is the same mat being used to replace the second fail word line FWL<2>.

In an embodiment, the second fail word line FWL<2> may be replaced by a redundancy word line RWL of any mat even if this mat used to replace the second fail word line FWL<2> is the same mat being used to replace the first fail word line FWL<1>.

Figure 6:
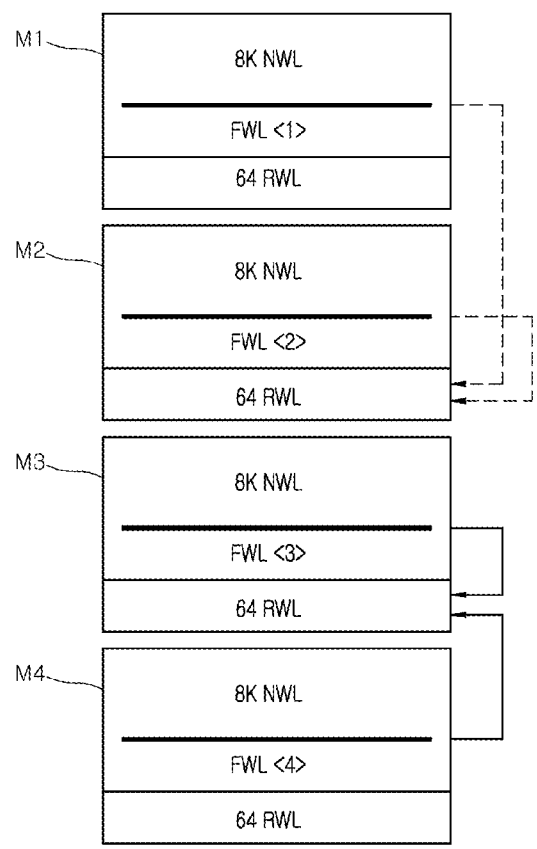

FIG. 6 illustrates a case that four fail word lines exist in the first to fourth mats M1~M4. For example, FIG. 6 illustrates a case where one of the normal word lines NWL included in the first mat M1 is a first fail word line FWL<1>, one of the normal word lines NWL included in the second mat M2 is a second fail word line FWL<2>, one of the normal word lines NWL included in the third mat M3 is a third fail word line FWL<3>, and one of the normal word lines NWL included in the fourth mat M4 is a fourth fail word line FWL<4>.

Referring to FIG. 6, the first fail word line FWL<1> of the first mat M1 may be replaced with any one of the redundancy word lines RWL included in the second mat M2, and the second fail word line FWL<2> of the second mat M2 may be replaced with any one of the remaining redundancy word lines RWL in the second mat M2 (see arrows indicated by dotted lines).

The third fail word line FWL<3> of the third mat M3 may be replaced with any one of the redundancy word lines RWL included in the third mat M3, and the fourth fail word line FWL<4> of the fourth mat M4 may be replaced with any one of the remaining redundancy word lines RWL in the third mat M3 (see arrows indicated by solid lines).

That is, if the first to fourth fail word lines FWL<1:4> are respectively located in the first to fourth mats M1~M4, the memory circuit may be designed such that the first to fourth fail word lines FWL<1:4> are replaced with four of all of the redundancy word lines RWL included in the first to fourth mats M1~M4 regardless of locations of the mats, on condition that the number of the redundancy word lines replacing the fail word lines is at most two in each of the first to fourth mats M1~M4.

Figure 7:
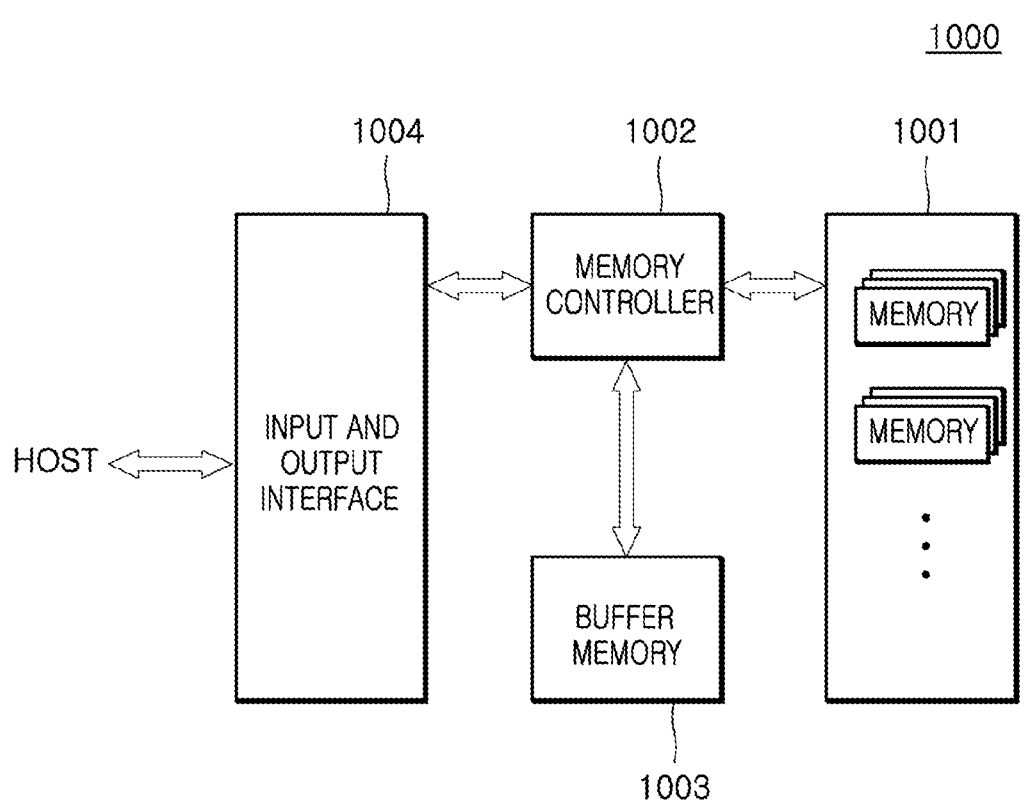
FIG. 7 is a block diagram illustrating a representation of an example of a configuration of an electronic system including at least one of the semiconductor devices illustrated in FIGS. 1 and 3.

At least one of the semiconductor devices described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1 or 3. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 7 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a refresh control circuit configured to compare addresses generated based on a command with fail addresses to generate a normal word line signal and a redundancy word line signal which are sequentially enabled during a predetermined time section based on a point of time that the command is inputted to the refresh control circuit; and a memory circuit configured to inactivate a fail word line connected to a failed memory cell based on the addresses if the normal word line signal is enabled and configured to activate a redundancy word line replacing the fail word line if the redundancy word line signal is enabled.

2. The semiconductor device of claim 1, wherein the command, for a refresh operation, is provided externally from the semiconductor device.

3. The semiconductor device of claim 1, wherein the predetermined time section is a time period from a point of time that the command is inputted until a point of time that a command is inputted again.

4. The semiconductor device of claim 1, wherein the refresh control circuit includes:
an address generation circuit configured to generate the addresses and sequentially count the addresses based on the command;
a comparison circuit configured to generate a comparison signal which is enabled if a combination of the fail addresses is consistent with a combination of the addresses; and
a word line control circuit configured to generate the normal word line signal which is enabled based on the comparison signal and configured to generate the redundancy word line signal which is enabled after a point of time that the normal word line signal is enabled.

5. The semiconductor device of claim 4, further comprising a fuse circuit configured to include a plurality of fuse cells and configured to output the fail addresses generated according to electrical open/short states of the plurality of fuse cells based on the command.

6. The semiconductor device of claim 1, wherein the memory circuit includes:
a first mat configured to inactivate the fail word line based on the normal word line signal if a combination of the addresses corresponds to a position of the fail word line;
a second mat configured to activate a normal word line selected according to a combination of the addresses based on the normal word line signal and configured to activate a redundancy word line replacing the fail word line based on the redundancy word line signal; and
wherein the redundancy word line replacing the fail word line is included in the first or second mat regardless of a location of the first or second mat.

7. The semiconductor device of claim 1, wherein each of the first and second mats includes a plurality of normal word lines which are activated according to combinations of the addresses based on the normal word line signal and a plurality of redundancy word lines which are activated based on the redundancy word line signal.

8. The semiconductor device of claim 7, wherein a number of the redundancy word lines replacing the fail word lines is at most two in each of the first and second mats, regardless of locations of the first and second mats.

9. The semiconductor device of claim 7, wherein a number of bits of the addresses is set according to a number of the normal word lines included in the first to second mats.

10. A method of refreshing a semiconductor device, the method comprising:
performing a first refresh operation generating a normal word line signal and a redundancy word line signal based on a command if a combination of addresses is consistent with a combination of fail addresses, wherein the normal word line signal and the redundancy word line signal are sequentially enabled during a predetermined time section from a point of time that the command is inputted; and
performing a second refresh operation that inactivates a fail word line connected to a failed memory cell included in a first mat based on the normal word line signal, activates a plurality of normal word lines included in a second mat based on the normal word line signal, and activates a redundancy word line included in the second mat to replace the fail word line of the first mat based on the redundancy word line signal.

11. The method of claim 10, wherein the command is provided externally from the semiconductor device.

12. The method of claim 10, wherein the predetermined time section is a time period from a point of time that the command is inputted until a point of time that a command is inputted again.

13. The method of claim 10, wherein performing the first refresh operation includes:
generating the addresses that are sequentially counted based on the command;
generating the fail addresses according to electrical open/short states of a plurality of fuse cells based on the command;
comparing the fail addresses with the addresses to generate a comparison signal which is enabled if a combination of the fail addresses is consistent with a combination of the addresses; and
generating the normal word line signal and the redundancy word line signal which are sequentially enabled based on the comparison signal.

14. The method of claim 10, wherein performing the second refresh operation includes:
inactivating the fail word line included in the first mat based on the normal word line signal if a combination of the addresses corresponds to a position of the fail word line;
activating the plurality of normal word lines, which are included in the second mat and selected according to combinations of the addresses, based on the normal word line signal; and
activating the redundancy word line replacing the fail word line of the first mat based on the redundancy word line signal.

15. The method of claim 10, wherein each of the first and second mats includes a plurality of normal word lines which are activated according to combinations of the addresses in response to the normal word line signal and a plurality of redundancy word lines which are activated in response to the redundancy word line signal.

16. A method of refreshing a semiconductor device, the method comprising:
performing a first refresh operation generating a normal word line signal and a redundancy word line signal based on a command if a combination of addresses is consistent with a combination of fail addresses, wherein the normal word line signal and the redundancy word line signal are sequentially enabled during a predetermined time section from a point of time that the command is inputted;
performing a second refresh operation that inactivates a first fail word line connected to a failed memory cell included in a first mat based on the normal word line signal, activates a first normal word line included in a second mat based on the normal word line signal, and activates a first redundancy word line included in the second mat to replace the first fail word line of the first mat based on the redundancy word line signal; and performing a third refresh operation that inactivates a second fail word line connected to a failed memory cell included in a third mat based on the normal word line signal, activates a second normal word line included in a fourth mat based on the normal word line signal, and activates a second redundancy word line included in the fourth mat to replace the second fail word line of the third mat based on the redundancy word line signal.

17. The method of claim 16, wherein the command is provided externally from the semiconductor device.

18. The method of claim 16, wherein the predetermined time section is a time period from a point of time that the command is inputted until a point of time that a command is inputted again.

19. The method of claim 16, wherein performing the first refresh operation includes:

generating the addresses that are sequentially counted based on the command;

generating the fail addresses according to electrical open/short states of a plurality of fuse cells based on the command;

comparing the fail addresses with the addresses to generate a comparison signal which is enabled if a combination of the fail addresses is consistent with a combination of the addresses; and generating the normal word line signal and the redundancy word line signal which are sequentially enabled based on the comparison signal.

20. The method of claim 16, wherein performing the second refresh operation includes:

inactivating the first fail word line included in the first mat based on the normal word line signal if a combination of the addresses corresponds to a position of the first fail word line;

activating the first normal word line, which is included in the second mat and selected according to a combination of the addresses, based on the normal word line signal; and activating the first redundancy word line included in the second mat to replace the first fail word line based on the redundancy word line signal.

21. The method of claim 16, wherein performing the third refresh operation includes:

inactivating the second fail word line included in the third mat based on the normal word line signal if a combination of the addresses corresponds to a position of the second fail word line;

activating the second normal word line, which is included in the fourth mat and selected according to a combination of the addresses, based on the normal word line signal; and activating the second redundancy word line included in the fourth mat to replace the second fail word line based on the redundancy word line signal.

22. The method of claim 16, wherein each of the first to fourth mats includes a plurality of normal word lines which are activated according to combinations of the addresses based on the normal word line signal and a plurality of redundancy word lines which are activated based on the redundancy word line signal.

* * * * *